(12) United States Patent
Gonsiorawski

(10) Patent No.: US 6,660,930 B1
(45) Date of Patent: Dec. 9, 2003

(54) SOLAR CELL MODULES WITH IMPROVED BACKSKIN

(75) Inventor: Ronald C. Gonsiorawski, Danvers, MA (US)

(73) Assignee: RWE Schott Solar, Inc., Billerica, MA (US)

( * ) Notice: Subject to any disclaimer, the term of this patent is extended or adjusted under 35 U.S.C. 154(b) by 0 days.

(21) Appl. No.: 10/171,021

(22) Filed: Jun. 12, 2002

(51) Int. Cl.⁷ .................. H01L 31/048; H01L 31/18
(52) U.S. Cl. .................. 136/251; 136/244; 257/433; 257/788; 257/789; 257/790; 438/66; 438/80; 438/64; 438/67; 427/74
(58) Field of Search .............. 136/251, 244; 257/433, 788, 789, 790; 438/66, 80, 64, 67; 427/74

(56) References Cited

U.S. PATENT DOCUMENTS

| | | | |
|---|---|---|---|
| 5,367,048 A | 11/1994 | Shaw | 528/367 |
| 5,721,314 A | 2/1998 | Hausmann | 525/71 |
| 5,741,370 A | 4/1998 | Hanoka | 136/251 |
| 5,762,720 A | 6/1998 | Hanoka et al. | 136/251 |
| 6,114,046 A * | 9/2000 | Hanoka | 428/515 |
| 6,217,982 B1 | 4/2001 | Dawson | 428/151 |
| 6,319,596 B1 * | 11/2001 | Kernander et al. | 428/215 |
| 6,320,116 B1 * | 11/2001 | Hanoka | 136/251 |
| 6,353,042 B1 * | 3/2002 | Hanoka et al. | 523/207 |
| 6,369,316 B1 * | 4/2002 | Plessing et al. | 136/251 |
| 2003/0000568 A1 * | 1/2003 | Gonsiorawski | 136/251 |

FOREIGN PATENT DOCUMENTS

JP    2001-119056 A  *  4/2001

OTHER PUBLICATIONS

Plastics Technology, Online Article, "NPE Newsfinder: Engineering Thermoplastics" by L. Sherman, dated May 2000.
DuPont article "Surlyn Reflection Series", Copyright 1998.
eFunda article re Engineering Fundamentals, "Molecular Structure", Copyright 2002.
DuPont article re DuPont Automotive, "New Surlyn Reflection Series Supergloss Molding Alloy Makes The Difference In Colored Exterior Parts", Copyright 2001.

* cited by examiner

Primary Examiner—Alan Diamond
(74) Attorney, Agent, or Firm—Pandiscio & Pandiscio

(57) ABSTRACT

A laminated solar cell module comprises a front light transmitting support, a plurality of interconnected solar cells encapsulated by a light-transmitting encapsulant material, and an improved backskin formed of an ionomer/nylon alloy. The improved backskin has a toughness and melting point temperature sufficiently great to avoid any likelihood of it being pierced by any of the components that interconnect the solar cells.

18 Claims, 1 Drawing Sheet

SOLAR CELL MODULES WITH IMPROVED BACKSKIN

Figure 1:
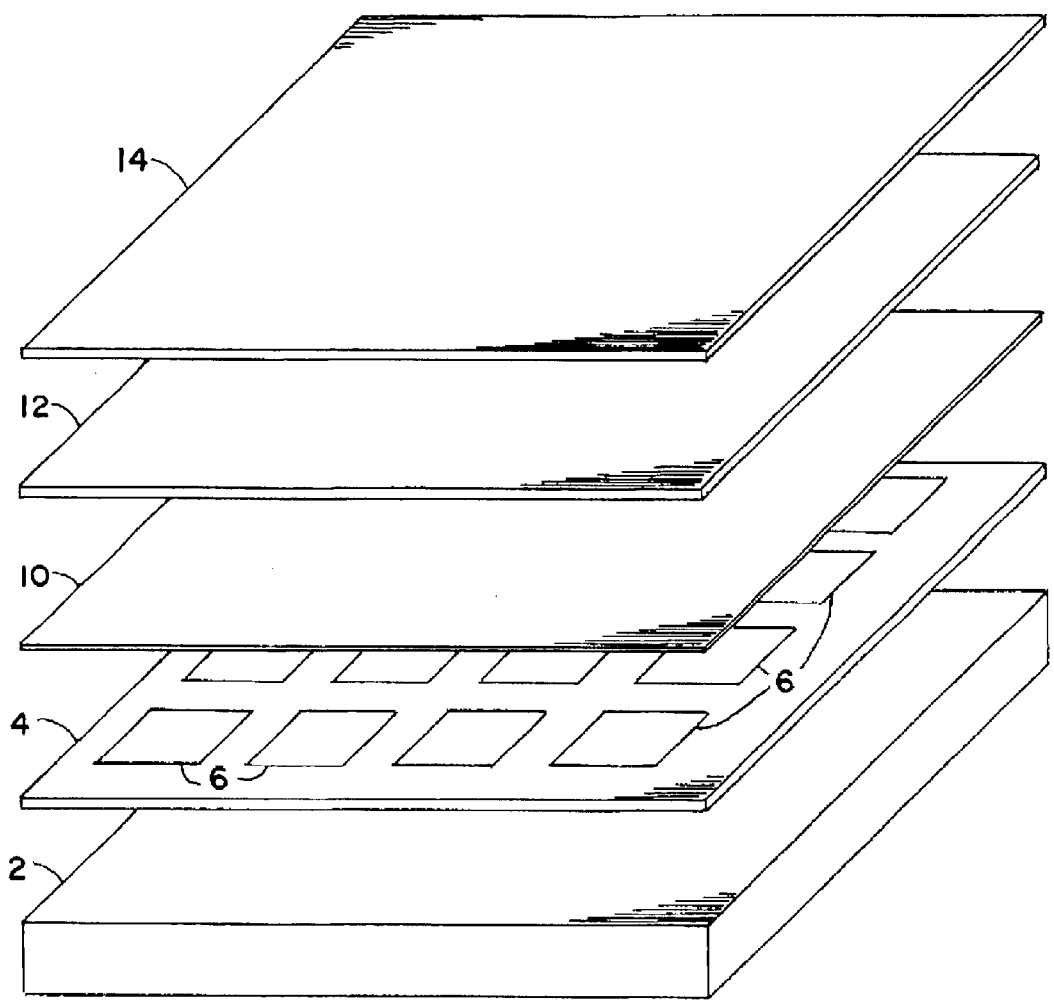

This invention was developed under DOE Subcontract No. ZAX-8-17647-10.

FIELD OF THE INVENTION

This invention relates to the manufacture of photovoltaic solar cell modules and more particularly to provision of solar cell modules having an improved backskin.

BACKGROUND OF THE INVENTION

A common form of solar cell module is made by interconnecting individually formed and separate solar cells, e.g., crystalline silicon solar cell, and then mechanically supporting and protecting the cells against environmental degradation by integrating the cells into a laminated solar cell module. The laminated modules usually comprise a stiff transparent protective front panel or sheet, and a rear panel or sheet typically called a "backskin". Disposed between the front and back sheets so as to form a sandwich arrangement are the interconnected solar cells and an encapsulant. A necessary requirement of the encapsulant (or at least that portion thereof that extends between the front sides of the cells and the transparent front panel) is that it be transparent to solar radiation. The typical mode of forming the laminated module is to assemble a sandwich comprising in order a transparent panel, e.g., a front panel made of glass or a transparent polymer, a front layer of at least one sheet of encapsulant, an array of solar cells interconnected by electrical conductors (with the front sides of the cells facing the transparent panel), a back layer of at least one sheet of encapsulant, a sheet of scrim to facilitate gas removal during the lamination process, and a backskin or back panel, and then bonding those components together under heat and pressure using a vacuum-type laminator. The back layer of encapsulant may be transparent or any other color, and prior art modules have been formed using a backskin consisting of a thermoplastic polymer, glass or some other material.

Although the lamination process seals the several layered components together throughout the full expanse of the module, it is common practice to apply a protective polymeric edge sealant to the module so as to assure that moisture will not penetrate the edge portion of the module. The polymeric edge sealant may be in the form of a strip of tape or a caulking-type compound. Another common practice is to provide the module with a perimeter frame, usually made of a metal like aluminum, to provide mechanical edge protection. The foregoing prior art techniques are disclosed or suggested in U.S. Pat. No. 5,741,370, issued Apr. 21, 1998 to Jack I. Hanoka for "Solar Cell Modules With Improved Backskin And Methods For Forming Same". That patent also discloses the concept of eliminating the back layer of encapsulant and bonding a thermoplastic backskin directly to the interconnected solar cells.

Heretofore a large number of materials have been used or considered for use as the encapsulant in modules made up of individual silicon solar cells. Until at least about 1995, ethylene vinyl acetate copolymrer (commonly known as "EVA") was considered the best encapsulant for modules comprising crystalline silicon solar cells. However, EVA has certain limitations: (1) it decomposes under sunlight, with the result that it discolors and gets progressively darker, and (2) its decomposition releases acetic acid which in turn promotes further degradation, particularly in the presence of oxygen and/or heat.

U.S. Pat. No. 5,478,402, issued Dec. 20, 1995 to J. Hanoka, discloses use of an ionomer as a cell encapsulant substitute for EVA. Relevant information contained in that patent is incorporated herein by reference. The use of ionomer as an encapsulant is further disclosed in U.S. Pat. No. 5,741,370, supra. The term "ionomer" and the type of resins identified thereby are well known in the art, as evidenced by Richard W. Rees, "Ionic Bonding In Thermoplastic Resins", DuPont Innovation, 1971,2(2), pp. 1–4, and Richard W. Rees, "Physical Properties And Structural Features Of Surlyn® Ionomer Resins", Polyelectrolytes, 1976, C, 177–197. Ionomers may be formed by partial neutralization of ethylene-methacrylic acid copolymers or ethylene-acrylic acid copolymers with organic bases having cations of elements from Groups I, II, or III of the Periodic Table, notably, sodium, zinc, aluminum, lithium, magnesium and barium. Surlyn® ionomers have been identified as copolymers of ethylene and methacrylic acid that typically have a melting point in the range of 83°–95° C.

Although it is known to use a rear panel or backskin that is made of the same material as the front panel, a preferred and common practice is to make it of a different material, preferably a material that weights substantially less than glass. e.g., a material such as TEDLAR® (the trade name for a polyvinyl fluoride polymer made by E.I. DuPont de Nemeurs Co.). Heretofore a popular and widely used backskin material has been a TEDLAR/polyester/ethylene vinyl acetate laminate. However, TEDLAR and TEDLAR laminates are not totally impervious to moisture, and as a consequence over time the power output and/or the useful life of modules made with this kind of backskin material is reduced due to electrical shorting resulting from absorbed moisture.

U.S. Pat. No. 5,741,370, supra, suggests that manufacturing and module mounting costs could be reduced by using as the backskin material a thermoplastic olefin comprising a combination of two different ionomers, e.g., a sodium ionomer and a zinc second ionomer, with that combination being described as producing a synergistic effect which improves the water vapor barrier property of the backskin material over and above the barrier property of either of the individual ionomer components. Significantly the patent discloses shows use of an ionomer encapsulant with the dual ionomer backskin.

However, the water absorption characteristics of all sodium ionomers are not identical. The same is true, but to a lesser extent, of zinc ionomers. More importantly, the water absorption characteristics of zinc ionomers tend to be substantially less, than those of sodium ionomers. Significantly modules made using sodium based ionomers as encapsulants, as taught by U.S. Pat. No. 5,478,402, tend to degrade with time, often in a matter of months, with portions of the encapsulant changing color. This discoloration, which occurs at multiple points along the length and breadth of the module, reduces the ionomer's light transmissibility, thereby lowering the module's energy conversion efficiency and power output, as well as rendering it less appealing from an aesthetic viewpoint. Degradation of the ionomer destroys the electrical insulation resistance, causing electrolytic corrosion plus a loss of required safety provisions. Such sodium ionomer degradation is known to result from moisture absorption, and also from another cause related to the solar cell interconnections.

As disclosed in copending U.S. patent application Ser. No. 10/35,107, pending filed Dec. 27, 2001 by R. C. Gonsiorawski for "Encapsulated Photovoltaic Modules And Method Of Manufacturing Same", the teachings of which are incorporated herein by reference, sodium ionomer degradation may be induced by solder flux residues. It should be noted that the conductors (tabbing) used to interconnect individual solar cells are secured in place by a solder. The solder may be applied separately or the conductors may be pre-tined, i.e., provided with a solder layer, to facilitate soldering. In both cases, the solder or soldering process includes a flux composition for removing oxide films and ensuring adequate wetting of surfaces. Commonly it is preferred to use pre-tinned conductors which also have been coated with a suitable flux composition. The fluxes commonly comprise an inorganic or organic acid or acid salt, e.g., a carboxylate or a benzoate compound such as the one sold under the name "Pentoate". Although the flux compositions are designed to be eliminated by vaporization directly or via decomposition during the soldering process, in practice some flux residue may continue to exist at the soldered connection points in contact with the surrounding ionomer encapsulant. Sodium ionomers, also known as sodium-based ionomers, are reactive to acid, with the result that acid reaction discolorations tend to occur in those portions of the sodium ionomer that come in contact with the flux residues. Because the flux residue tends to be present in a small amount and scattered throughout the module, its deleterious affect on the encapsulant may not be immediate or immediately visible. However, over time, particularly under relatively high ambient temperatures, the flux-induced degradation of the sodium ionomer can progress sufficiently to adversely affect the power output and stability of the module. By way of example, and as noted in said copending application Ser. No. 10/035,107, flux residues have been determined to be a factor in failure of modules wherein the encapsulant was the SURLYN® 1601 ionomer recommended in U.S. Pat. No. 5,478,402, supra.

The invention described in said copending application Ser. No. 10/035,107 overcomes the problem of flux-induced ionomer degradation by using an encapsulant in the form of a zinc ionomer. Zinc ionomers exist that are available in sheet form, transparent, stable and capable of heat bonding to adjacent components of a solar cell module. Zinc ionomers tend to absorb water less readily than sodium ionomers. Such zinc-based ionomers are exemplified by two DuPont products identified as ® 1705-1 and ® 1706. These polymers have excellent optical properties and high hot tack strength. The exact chemical composition of these materials is not known, but they are believed to be produced by adding a salt containing zinc cations to a copolymer of ethylene-methacrylic acid, or to a copolymer of ethylene-acrylic acid, and subjecting that composition to acid neutralization, resulting in the formation of ion clusters within the resulting polymer matrix. The ® 1705-1 ionomer material has a water absorption of 0.3% wt. % in comparison with the sodium based ® 1601 and EVA which have water absorptions of 3.0 wt. % and 0.7% wt. % respectively. Further, the zinc based ionomers are substantially inert to acid flux residues. As a consequence, modules made using the zinc ® 1705-1 ionomer as encapsulant and a TEDLAR® backskin were found to pass stress tests of 1000 hours at 85% RH/85° C. damp heat as well as the humidity-freeze cycling (85/85 to 0–40) for 20 cycles without decreased electrical photovoltaic performance while fully satisfying the safety criteria of the wet and dry high voltage withstand tests at 3600 volts as well as the insulation resistance criteria measured at 500 volts.

Nevertheless it is desirable to provide modules that are capable of withstanding stress tests for substantially more than standard 1000 hours. It also is desirable to provide a backskin material and a method of forming laminated solar cell modules incorporating same. In this connection, it should be noted that the conductors that interconnect the solar cells commonly are arranged to form stress relief loops to compensate for expansion and contraction caused by temperature changes. Those loops need to be encapsulated with the cells. However, when a polymeric backskin is used, are must be taken to make certain that the stress loops will not pierce the backskin when the several layers are compressed under heat to form the laminated module. Penetration of the backskin by one or more stress loops will promote early failure of the module, e.g., by short-circuiting resulting from ingress of moisture at the point(s) of stress loop penetration the backskin. The present invention recognizes that the thermoplastic backskin should have a melting point higher than the encapsulant, and capitalizes on the fact that the likelihood of backskin penetration by components of a solar cell module, during or as a consequence of the lamination process, increases the closer that the melting point of the thermoplastic backskin is to the melting point of the encapsulant.

OBJECTS AND SUMMARY OF THE INVENTION

One primary object of this invention is to improve upon the backskin component of solar cell modules.

Another primary object of this invention is to provide solar cell modules characterized by an improved backskin.

Another object is to provide an improved method of making solar cell modules characterized in that the modules embody improved backskins.

Still another object is to provide modules characterized by backskins made of a material that has a high dielectric strength and extends the useful life of the modules.

A further object is to provide modules of interconnected crystalline silicon solar cells that withstand degradation substantially better than modules made with backskins of TEDLAR®, TEDLAR® laminates, or a combination of two ionomers.

A more specific object is to a backskin material that bonds readily to the ionomer encapsulant and associated components of a laminated solar cell module with little risk of it being pierced by mechanical components of the module during or as a result of the laminating process.

A further object is to provide laminated solar cell modules having a backskin that melts at a relatively high temperature and is sufficiently tough to resist being pierced or penetrated by mechanical components of the module as a consequence of the heat and pressure applied during the laminating process.

The foregoing objects and other objects rendered obvious from the following detailed description are achieved by using an ionomer/nylon alloy as the backskin material. That novel backskin material has a number of advantages that are described in or rendered obvious by the following detailed description of the invention.

THE DRAWINGS

Figure 2:
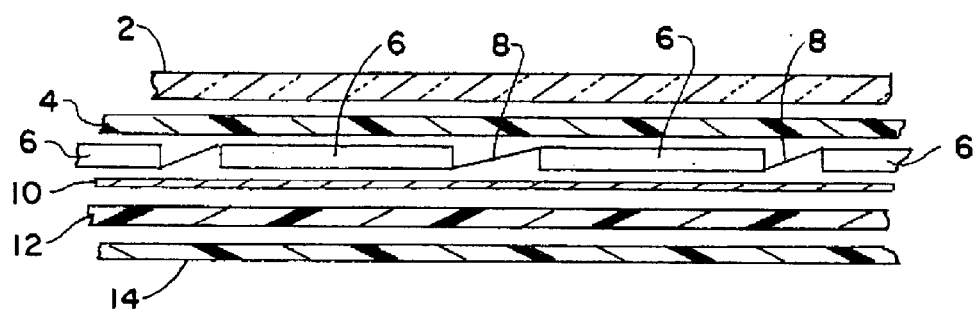

FIG. 1 is an exploded schematic representation of the components of a solar cell module incorporating the present invention; and FIG. 2 is a schematic representation of a cross-section of a laminated solar cell module.

In the drawings, like components are identified by like numerals.

DETAILED DESCRIPTION OF THE INVENTION

FIGS. 1 and 2 schematically illustrate components of a conventional form of solar cell module which may be modified to incorporate the present invention. In FIG. 2, the thicknesses of the components are not intended to be to scale. The components used to construct the solar cell module comprise a transparent front panel or superstrate 2, a first layer 4 of a light transmitting encapsulant, an array of separately formed crystalline solar cells 6 interconnected by conductors 8 (FIG. 2), a porous scrim sheet 10, a second layer 12 of a transparent encapsulant, and a protective back panel or backskin 14. Although not shown in FIG. 2, it is to be understood that some, and all, of the individual conductors 8 that connect adjacent solar cells or strings of cells are oversize in length for stress relief and may form individual loops between the cells. Each cell has a first electrode or contact (not shown) on its front radiation-receiving surface and a second electrode or contact (also not shown) on its back surface, with the conductors 8 being soldered to those contacts to establish the desired electrical circuit configuration. Each of the layers 4 and 12 may comprise one or more sheets of encapsulant material, depending upon the thickness in which the encapsulant is commercially available. Although not shown, it is to be understood that the solar cells are oriented so that their front contacts face the glass panel 2, and also the cells are arranged in rows, i.e., strings, with the several strings being connected by other conductors similar to conductors 8 and with the whole array having terminal leads (not shown) that extend out through a side of the assembly of components. The foregoing components are assembled in sandwich fashion, starting with the glass panel 2 on the bottom. After the sandwich has been assembled, it is transferred to a laminating apparatus (not shown) where its components are subjected to the laminating process. The laminating apparatus is essentially a vacuum press having heating means and a flexible wall or bladder member that coacts with a wall member or platen to compress the components together when the press is closed and evacuated. The sandwich is positioned within the press and then the closed press is operated so as to heat the sandwich in vacuum to a selected temperature at which the encapsulant will melt enough to flow around the cells, usually a temperature of at least 120° C., with the pressure applied to the components increasing at a selected rate to a maximum level, usually in the range of about 390 to about 410 torr minimum. These temperature and pressure conditions are maintained long enough, typically for about 3 to 10 minutes, to assure that the encapsulant has melted or softened enough to flow around and fully encapsulate the interconnected cells and fully contact the front and back panels, after which the pressure is maintained at or near the foregoing minimum level while the assembly is allowed to cool to about 80° C. or less so as to cause the encapsulant to form a solid bond with the adjacent components of the module. The pressure exerted on the sandwich of module components reaches its maximum level only after the assembled components have reached the desired maximum temperature in order to allow the ionomer to flow as required and also to assure full removal of air and moisture.

The present invention involves the use of an ionomer/nylon alloy in sheet form as a backskin material. The term "nylon" designates long chain polyamides that typically soften at temperatures near about 200° C. and melt at temperatures near about 420° C. As used herein, the term "alloy" is used to describe a polymer blend, which may include copolymers, that form a distinct polymer substance. Various ionomer/nylon alloys are available. The present invention stems from the discovery that a commercial product known as SURLYN REFLECTIONS SG 201U Film possesses the properties desired for a backskin material. That product is manufactured by E.I. DuPont de Nemeurs Company and is available as a thermoplastic film. It also offers the advantage in that it can be modified by the addition of $TiO_2$ white pigment which improves its UV reflection properties and also further enhances weathering resistance. The material used in practicing this invention is provided with a corona surface treatment to facilitate bonding to adjacent components.

The specifications of the SURLYN® REFLECTIONS SG 201U Film used in practicing the invention are set forth in Table I. Further, although the exact chemical composition of the SG 201U film is not known to Applicant, it appears to be composed of approximately 42% ionomer and 58% nylon by weight. Further it is readily identified by its physical properties. The physical properties are set forth in Table II.

TABLE 1

MATERIAL SPECIFICATIONS

| | |
|---|---|
| BASE MATERIAL | Dupont SG201UC NC010 |
| COLOR | Natural Color |
| $TiO_2$ (R960)-ADDITIVE | 10% |
| FILM SIZE (inch) | Thickness = 0.010 |
| SURFACE TREATMENT | CORONA Discharge to both surfaces |
| CORONA DISCHARGE | 50 dynes/cm |

TABLE 2

PROPERTIES

| Property | Typical Value | Test Method |
|---|---|---|
| TENSILE STRENGTH | 44.8 Mpa (6500 psi) | ASTM D638 |
| ELONGATION AT BREAK | >200% | ASTM D638 |
| HDT @66 PSI | 58° C. (137° C.) | ASTM D648 |
| VICAT | 190° C. | ASTM D1525 |
| SPECIFIC GRAVITY | 1.043 | ASTM D792 |
| MOLD SHRINKAGE | 1.0% | ASTM D955 |
| MELT TEMPERATURE RANGE | 235–250° C. | |
| MOLD TEMPERATURE RANGE | 40–80° C. | |
| DIELECTRIC STRENGTH | 1918 Volt/mil | ASTM D149 |
| MVTR (37.8 C, 100% RH g/H2O/100 in2/day/mil) | 0.93 | |

The value of the ionomer/nylon material as a backskin was determined from experimental tests conducted on test modules constructed according to a generic packaging format as set forth in FIG. 1. Essentially, the test modules consisted of a front panel or layer of glass, a front encapsulant layer of SURLYN® 1705 ionomer, an array of solar cells electrically and mechanically interconnected as described above, a sheet of fiberglass scrim, a back encapsulant layer of SURLYN® 1705 ionomer, and a sheet of a thermoplastic polymeric material to serve as a backskin. Using the foregoing packaging format, three separate polymeric materials were evaluated as backskins. One backskin consisted of TEDLAR® (0.002 inch thick), a second consisted of a TEDLAR®/polyester/TEDLAR® ("TPT") laminate (0.007 inch thick), and the third consisted of a sheet of the SURLYN® REFLECTIONS SG 201U ionomer/nylon alloy (0.010 inch thick). A number of modules were made with each backskin material. The components were laminated together according to the method set forth in the following specific example illustrating the invention, with the temperature conditions at which the lamination was conducted being the same for all three backskin materials, namely, a minimum temperature of about 120° C.

The test modules were subjected to stress tests. These involved subjecting the modules (a) to damp/heat (85% RH/85° C.) for 1000 hours, (b) 20 humidity-freeze cycles in which the temperature of the modules was cycled between a high of 85%RH/85° C. (20 hours) and a low of −40° C. (1 hour), and (c) 200 temperature cycles in which the modules were cycled between 90° C. (1 hour) and 0° C. (1 hour). Thereafter the modules were subjected to two test procedures. One procedure (UL approved), known as the "wet voltage withstand test", involves immersing the module in water and subjecting it to a test voltage of 3000 volts to determine the existence of any short circuits. The second test involves measuring and comparing the electrical properties of the modules before and after subjecting them to the damp heat and temperature cycling procedures, with the principal measurement being that of the dielectric strength. The modules with the TEDLAR® backskin failed the post-stress safety criteria of wet insulation resistance and wet high potential withstand. The modules with the TPT backskin functioned well, passing the 1000 hours stress tests. However, TPT backskins have a well-known historic limitation of hydrolytic deterioration that cannot exceed 1500 hours of accelerated damp heat stress. The modules made with the ionomer/nylon alloy backskin showed no signs of post-stress deterioration. In fact, the modules were stress-tested further and were found to show an electrical properties degradation of less than 4% after about 4000 hours of damp heat (at 85% RH/85° C.) and 20 humidity-freeze cycles under the temperature cycling conditions described above. That result has not been attainable with prior laminated solar cell modules constructed according to the same or a similar packaging format.

With respect to electrical insulation characteristics, it is to be noted that the ionomer/nylon backskin material provided according to this invention has been tested for dielectric strength and has exhibited a TÜV partial discharge surface loading rating of 850 volts, thereby making it eligible for TÜV Safety Class II approval for system voltages up to 850 volts. The importance of that 840 volt TÜV rating is made evident when compared with commercially available 7 mils thick TPT which is TÜV de-rated to about 400 volts. A TÜV surface loading rating of about 850 volts can be achieved with TPT backskins provided that the thickness of the polyester (P) layer is increased from its approximately 3 mil normal thickness to a thickness in the range of 8 to 10 mils. However, that increased P thickness risks early failure from moisture or hydrolytic embrittlement.

Following is a specific example of how to practice the invention.

EXAMPLE

A sheet of tempered solar grade. CeO-free glass, having a thickness of 3/16 inch, is placed face down on a supporting surface. The upwardly facing surface of the glass sheet has been primed with SILQUEST A1100, an amino silane product of OSI Specialties of South Charleston, W. Va. 25303. Two 0.010 inch thick corona-treated sheets of 1705 zinc based ionomer, modified with 0.30% CHIMASORB 944 (a UV light stabilizer) and 0.30% TINUVIN 328 (a UV light absorber), are placed over the top surface of the glass sheet. An array of inter-connected silicon solar cells made from rectangular polycrystalline EFG-grown wafers is placed on top of the two sheets, with the front contacts of the cells facing the glass sheet. The wafers comprise p-n junctions formed by doping. The conductors interconnecting the solar cells have been soldered to the front and back contacts of the cells using a tin/silver solder and an acidic carboxylate flux. The ionomer sheets are oriented so that the corona-treated surface of one sheet engages the glass sheet, and the corona-treated surface of the second sheet faces the array of solar cells. A scrim layer with a thickness of about 0.005 inch is placed over the array of solar cells in contact with the back contacts of the cells and the interconnecting conductors. Then another 0.010 inch thick sheet of the same modified 1705 zinc ionomer is placed over the scrim with its corona-treated surface facing away from the scrim, and that ionomer sheet is covered by a back sheet of the corona-treated SURLYN® REFLECTIONS SG 201 U thermoplastic ionomer/nylon alloy identified in Tables 1 and 2. The resulting sandwich-like assembly is placed in a vacuum press and laminated.

The lamination is conducted by operating the press so that the following operating conditions are established: (1) the assembly is heated from the ambient temperature to a temperature of about 120° C. over a period of about 8 minutes and during that time evacuation of the press is initiated to evacuate air and moisture; (2) a pressure gradient is progressively applied across the sandwich so as to reach a maximum of about 700 torr after the components have been at the temperature of about 120° C. for about 2–5 minutes, (3) the venting is stopped so as to maintain the approximately 700 torr pressure, and heating continues so as to maintain the components at the 120° C. level for about an additional 3–8 minutes, after which heating is terminated so as to allow the assembly to cool; (4) the pressure gradient is maintained at or slightly below 700 torr until the assembly has cooled to about 80° C.; and (5) thereafter the pressure gradient is reduced to zero and the press is opened to remove the resulting laminated product. In the laminated product the several ionomer sheets have formed a strong bond with adjacent components and also been fused to one another in between the cells and also at the periphery of the module. This laminated module product may then be provided with a surrounding aluminum frame to form a discrete solar panel, with or without an additional edge sealant, in the manner well known to persons skilled in the art, e.g. as disclosed by U.S. Pat. No. 5,762,720, issued Jun. 9, 1998 to Jack I. Hanoka et al, U.S. Pat. No. 5,733,382 issued Mar. 31, 1998 to Jack I. Hanoka, and said U.S. Pat. No. 5,478,402, all of which are incorporated herein by reference.

It is believed that the improved stress test results achieved using the SURYLYN REFLECTIONS SG 201 U alloy disclosed herein are due primarily to the presence of its nylon component and that comparable stress test results can be obtained using other ionomer/nylon alloys characterized by different relative proportions of ionomer and nylon and/or a different nylon or ionomer component, provided that such other alloy is thermoplastic and has a melting point substantially higher than the encapsulant, preferably a melting point of 200° C. or higher.

Obviously it is possible to modify various other components of the solar modules and the method of laminating the components without departing from the scope of the invention. For one thing, the novel ionomer/nylon backskin provided by this invention may be used in modules that use some other encapsulant, e.g. EVA. The latter bonds readily to an ionomer/nylon alloy material. In this connection it is to be appreciated that although a laminating temperature of about 120° C. is preferred, as set forth in the foregoing example, in practice the laminating temperature may vary from about 110° C. to about 190° C., depending on the melting point of the particular encapsulant that is used. A laminating pressure in the range of 500 to 725 torr is suitable for practicing the invention.

For another thing the invention may be used in the manufacture of modules comprising different forms of solar cells known to persons skilled in the art. As is evident from the foregoing description, silicon solar cells of the type contemplated herein comprise silicon wafers with a p-n junction formed by doping, as disclosed, for example, in U.S. Pat. No. 4,751,191, issued Jun. 14, 1988 to R. C. Gonsiorawski et al, U.S. Pat. No. 5,178,685, issued Jan. 12, 1993 to J. T. Borenstein et al, and U.S. Pat. No. 5,270,248, issued Dec. 14, 1993 to M. D. Rosenblum et al. However, the invention may be used also in modules that comprise other crystalline cells formed independently of one another but interconnected by soldered conductors, as well as cells comprising a semiconductor substrate such as germanium or gallium arsenide onto which one or more layers of another crystalline material are epitaxially grown to form one or more junctions, as disclosed, for example, in U.S. Pat. No. 5,944,913, issued Aug. 31, 1999 to H. Q. Hou et al. and U.S. Pat. No. 6,252,287, issued Jun. 26, 2001 to S. R. Kurtz et al.

The invention also may be incorporated in modules that comprise so-called thin film solar cells. Typically such solar cell modules are produced by depositing several thin film layers on a substrate such as glass, with the layers being patterned so as to form a plurality of individual cells that are electrically interconnected to provide a suitable voltage output. Depending on the sequence in which the multi-layer deposition is carried out, the glass substrate may function as the back surface or as a front window for the module. By way of example, thin film solar cells are disclosed in U.S. Pat. No. 5,512,107, issued Apr. 30, 1996 to R. van der Berg; U.S. Pat. No. 5,948,176, issued Sep. 7, 1999 to K. V. Ramanathan et al.; U.S. Pat. No. 5,994,163, issued Nov. 30, 1999 to M. Bodegard et al.; U.S. Pat. No. 6,040,521, issued Mar. 21, 2000 to K. Kushiya et al; U.S Pat. No. 6,137,048, issued Oct. 24, 2000 to X. Wu; and U.S. Pat. No. 6,258,620, issued Jul. 10, 2001 to D. L. Morel et al. Examples of thin film solar cell modules are those that comprise cadmium telluride or CIGS thin filmcells. The term CIGS is the acronym for the composition $Cu(InGa)(SeS)_2$. Use of the invention with thin film cells is limited to the case where the substrate on which the cells are formed is a glass plate that is intended to function as the front window of the module. In such case the ionomer/nylon sheet may be used as the backskin of the module, with an intervening thermoplastic encapsulant being interposed to seal the backskin to the glass plate under heat and pressure.

Still other modifications may be made. Although modules made according to the invention using a zinc ionomer encapsulant and non-CeO doped glass as the front panel show advantages over the prior art with respect to the ionomer encapsulant resisting photoxidation and maintaining solar radiation transmission in the 400 to 800 nM wavelength range and are preferred due to the reduced cost of such glass, the invention may be practiced using a CeO-doped solar glass front panel where cost is not a controlling factor. Also the glass front panel may be replaced by a sheet of a transparent plastic material, e.g., a polycarbonate or an acrylic polymer.

The number and thickness of the ionomer encapsulant sheets used in making the module also may be varied. As suggested in said copending application Ser. No. 10/035, 107, the SURLYN® 1705 zinc ionomer may be replaced by the ® 1706 zinc ionomer which also has a high radiant energy transmissibility. However, use of the SURLYN® 1705 zinc ionomer is preferred since the SURLYN® 1706 ionomer requires that the lamination proceed at a temperature in the range of about 160° C. to about 185° C. Other zinc ionomers that are resistant to acids and have a relatively low moisture absorption also may be used as encapsulants so long as they meet the following requirements: acceptable light transmission, adequate bonding adherence, high melt flow, and resistance to photoxidation. It is to be understood also that various UV absorbers and stabilizers may be found to be acceptable substitutes for the TINUVIN 3289 and CHIMASORB 944 used in the specific example presented above.

To restate what has been determined by actual tests, laminated silicon solar cell modules made with an ionomer/nylon backskin according to this invention offer the advantage of withstanding the post stress test deterioration better, by a significant factor, than modules of like construction made with other thermoplastic backskins. Moreover, the ionomer/nylon alloy backskin offers the advantage that the alloy is a commercially available product and sheets of that alloy may be laminated without having to materially alter the laminating procedures heretofore used to form laminated solar cell modules. Also the backskin provides a strong and stable bond with the ionomer encapsulant (and to EVA encapsulant as well). Best of all, the ionomer/nylon alloy film is tough and has a melting temperature range (235° C. to 250° C.) that is sufficiently high in relation to the melting point of ionomer and EVA encapsulants as to be able to maintain its structural integrity during the laminating procedure and effectively resist piercing or penetration by any mechanical components, e.g., the stress loops of the electrical conductors, that may protrude backward from the plane of the solar cell array when the various layers (front panel, encapsulant, solar cell array, scrim and backskin) are compressed together during the laminating process. In contrast, a backskin comprising a combination of sodium and zinc ionomers, as taught by U.S. Pat. No. 5,741,370, supra, has a melting point closer to that of the encapsulant, with the result that there is a greater risk of a component like a stress loop violating the integrity of the backskin during or as a result of the laminating procedure.

Other modifications and advantages of the invention will be apparent to persons skilled in the art from the foregoing description.

What is claimed is:

1. A laminated solar cell module comprising:
   a front support layer formed of a light transmitting material and having first and second surfaces;
   a plurality of interconnected solar cells having a first surface facing said front support layer and a second surface facing away from said front support layer;
   a transparent encapsulant surrounding and encapsulating said interconnected solar cells, said transparent encapsulant being bonded to said second surface of said front support layer; and
   a backskin having a first surface facing said second surface of said front support layer and bonded to said transparent encapsulant and said solar cells, said backskin comprising an ionomer/nylon alloy in sheet form.

2. A module according to claim 1 wherein said ionomer/nylon alloy has a melting point of at least about 200° C.

3. A module according to claim 1 wherein said ionomer/nylon alloy is approximately 42% ionomer and 58% nylon by weight.

4. A module according to claim 1 wherein said transparent encapsulant is a zinc ionomer.

5. A module according to claim 1 wherein said cells are silicon solar cells.

6. A module according to claim 1 wherein said cells are thin film solar cells and said front support layer constitutes the substrate on which said thin film solar cells are formed.

7. A module according to claim 1 wherein said backskin alloy contains a UV reflecting white pigment.

8. An assembly for conversion under heat and pressure into a laminated solar cell module, said assembly comprising:
- a front support layer formed of a light transmitting material and having front and back surfaces;
- a first transparent thermoplastic encapsulant layer adjacent the back surface of said front support layer;
- a plurality of interconnected solar cells having first and second surfaces adjacent said first transparent encapsulant layer;
- a second transparent thermoplastic encapsulant layer disposed adjacent said solar cells in parallel relation to said first transparent encapsulant layer; and
- a thermoplastic backskin layer comprising an ionomer/nylon alloy in sheet form.

9. A method of manufacturing a solar cell module comprising:
- providing a front support layer formed of a light transmitting material and having front and back surfaces;
- placing a first transparent thermoplastic encapsulant layer adjacent the back surface of said front support layer;
- positioning a plurality of interconnected solar cells having first and second surfaces so that said first surfaces thereof are adjacent said first transparent encapsulant layer;
- placing a second transparent thermoplastic encapsulant layer adjacent said second surfaces of said solar cells;
- placing a thermoplastic backskin layer adjacent said second transparent thermoplastic encapsulant layer to thereby form an assembly;
- subjecting said assembly to heat and pressure so as to melt said encapsulant layers and cause the encapsulant to surround said cells, and
- cooling said assembly so as to cause said encapsulant to solidify and bond to said front support layer, said cells and said backskin, whereby to laminate said layers and said solar cells together to form an integrated solar cell module;
- characterized in that said backskin layer comprises an ionomer/nylon alloy.

10. Method according to claim 9 wherein said ionomer/nylon alloy has a melting point of at least about 200° C.

11. Method according to claim 9 wherein said alloy is in sheet form and has a corona-treated surface.

12. Method according to claim 9 further including the step of positioning a porous scrim layer between said solar cells and said backskin layer before said assembly is subjected to heat and pressure.

13. Method according to claim 9 wherein said encapsulant is a zinc ionomer.

14. Method according to claim 9 wherein said assembly is laminated by subjecting it to a pressure of at least 390 to 410 torr while heating it to a temperature of about 120° C.

15. Method according to claim 9 wherein said encapsulant is EVA or an ionomer.

16. In a photovoltaic module of the type having an array of electrically interconnected photovoltaic cells encapsulated between a transparent front panel and a back sheet by a light-transmitting encapsulant, the improvement wherein said back sheet is an ionomer/nylon alloy.

17. The photovoltaic module according to claim 16 wherein said encapsulant is an ionomer or EVA.

18. The photovoltaic module according to claim 16 wherein each of said cells has front and back contacts and said cells are interconnected by conductors that have been soldered in place using an acidic flux, and at least some of those conductors have stress relief loops or bends.

* * * * *